United States Patent
Buechner et al.

(10) Patent No.: US 8,510,072 B2
(45) Date of Patent: Aug. 13, 2013

(54) DETECTING AN UNSTABLE INPUT TO AN IC

(75) Inventors: Thomas Buechner, Weil im Schoenbuch (DE); Martin Eckert, Moetzingen (DE); Matthias Klein, Boeblingen (DE); Manfred Walz, Boeblingen (DE); Andreas Wagner, Boeblingen (DE); Gerhard Zilles, Jettingen (DE)

(73) Assignee: International Business Machines Corporation, Armonk, NY (US)

( * ) Notice: Subject to any disclaimer, the term of this patent is extended or adjusted under 35 U.S.C. 154(b) by 344 days.

(21) Appl. No.: 12/944,843

(22) Filed: Nov. 12, 2010

(65) Prior Publication Data
US 2012/0123724 A1 May 17, 2012

(51) Int. Cl.
*G01R 31/00* (2006.01)
*G01R 31/28* (2006.01)

(52) U.S. Cl.
USPC .......................... 702/117; 702/120; 714/732

(58) Field of Classification Search
USPC .......... 702/90, 117–120; 324/73.1; 713/501; 714/732; 326/39
See application file for complete search history.

(56) References Cited

U.S. PATENT DOCUMENTS

| | | | |
|---|---|---|---|
| 6,130,550 A * | 10/2000 | Zaliznyak et al. | 326/39 |
| 6,380,724 B1 | 4/2002 | Mahurin et al. | |
| 7,877,222 B2 * | 1/2011 | Boerstler et al. | 702/132 |
| 2008/0059102 A1 * | 3/2008 | Frankowsky et al. | 702/117 |
| 2009/0199036 A1 | 8/2009 | Warnock et al. | |
| 2010/0017667 A1 | 1/2010 | Klein et al. | |

FOREIGN PATENT DOCUMENTS

US WO2009/105787 A2 8/2009

OTHER PUBLICATIONS

K. Zarrineh et al., "System-on-Chip Testability Using LSSD Scan Structures," IEEE Design & Test of Computers, May-Jun. 2001, pp. 83-97.

* cited by examiner

*Primary Examiner* — John H Le
(74) *Attorney, Agent, or Firm* — Brevetto Law Group

(57) ABSTRACT

Additional circuitry is included in an input cell design structure for an integrated circuit to detect and report transitions on an input that was expected to be stable, and to store that event for later analysis. Two or more modified input cells may have their error indications daisy-chained together to minimize additional routing. The storage elements may be included in a scan chain to allow for isolation of which input had the unexpected transition.

21 Claims, 7 Drawing Sheets

DETECTING AN UNSTABLE INPUT TO AN IC

BACKGROUND

1. Field of the Invention

The present subject matter relates to a circuit and design structure for an input cell for a semiconductor integrated circuit (IC). More specifically, it relates to detecting an unstable input to the integrated circuit.

2. Description of Related Art

Many input/output (I/O) pins of integrated circuits are used for static control signals that are expected to not change their value over time. Examples of such signals include signals that are used during chip initialization but remain static in functional operation and "pervasive" control signals for test modes, clock control, PLL control, driver/receiver inhibits, and the like. Any unexpected value change on these input pins may lead to unexpected and undesired effects. There can be many different reasons for such unwanted glitches such as noise, wire shorts/opens on the printed circuit board, or software/firmware malfunction. The resulting error scenarios from such faults may be complex and may difficult to track back to the root cause.

Many integrated circuits (ICs) use a scan-based design methodology to reduce the cost and increase the coverage of test of the IC. Scan-based techniques can be very useful in determining a root-cause of defect mechanisms. While some ICs may implement a full scan-based design methodology, other designers may choose to implement a boundary scan methodology where the input/output (I/O) cells of an IC are included in a scan chain to allow easy control of IC outputs and easy capture of IC inputs at a system level.

SUMMARY

Various embodiments involve a method for detecting unstable inputs to an integrated circuit. An input value may be received on an external input of the integrated circuit which is connected to an input cell of the integrated circuit to drive trace to the rest of the IC based on the input value. A transition may be detected on the external input during a time period that the external input is expected to be stable and a value representing the transition may be stored into a storage element. An error output may also be asserted in response to the transition.

Embodiments may include an integrated circuit with an external input and a trace configured to be driven based on an electrical level received at the external input. A storage element may also be included where the storage element is initialized before a time period that the external input is expected to be stable. A transition detection circuit may detect a transition on the external input during the time period that the external input is expected to be stable and set the storage element to a value. An error trace may then be driven based on the value set in the storage element.

Other embodiments may include design structures for elements of the integrated circuit described above and an electronic system utilizing the integrated circuit described above.

BRIEF DESCRIPTION OF THE SEVERAL VIEWS OF THE DRAWINGS

The accompanying drawings, which are incorporated in and constitute part of the specification, illustrate various embodiments of the invention. Together with the general description, the drawings serve to explain the principles of the various embodiments. In the drawings.

DETAILED DESCRIPTION

Figure 1:
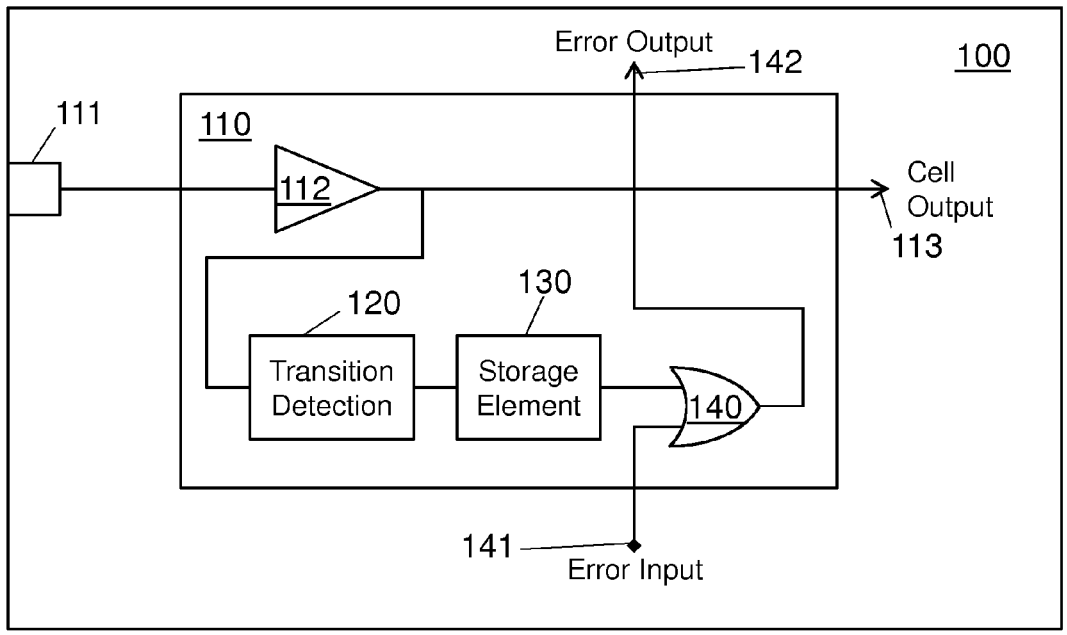
FIG. 1 shows a block diagram of a general embodiment of an input cell with an input error detector.

In the following detailed description, numerous specific details are set forth by way of examples in order to provide a thorough understanding of various embodiments. However, it should be apparent to those skilled in the art that the embodiments of the present disclosure may be practiced without such details. In other instances, well known methods, procedures and components have been described at a relatively high-level, without detail, in order to avoid unnecessarily obscuring aspects of the present concepts. A number of descriptive terms and phrases are used in describing the various embodiments of this disclosure. These descriptive terms and phrases are used to convey a generally agreed upon meaning to those skilled in the art unless a different definition is given in this specification. Some descriptive terms and phrases are presented in the following paragraphs for clarity.

An "external input" of an integrated circuit (IC) is meant to refer to an electrical connection of the integrated circuit to an electrical voltage or current from a source outside the IC. In some cases, the external input may also function as an output from the IC in some modes of operation, which may be alternatively referred to as an input/output (I/O) pin.

A "transition" on an input, as used herein, is meant to refer to a change in the electrical parameters presented at an input of an integrated circuit where at least one electrical parameter (e.g. voltage or current) changes to an extent that it is no longer inside the specified range for a particular input value. The input may actually change states from a first state to a second state (e.g. "0" to "1"), it may move from one input state to an undefined state and then back to the same input state, or it may change from a first state to a second state and then back to the first state in a short period of time. For example, an input may have a defined input voltage range where $-0.7 \leq V_{IL} \leq 0.8V$ for a logic "0" and $2.0 \leq V_{IH} \leq 6.0V$ for a logic "1", where the voltage range of $0.8V < V_1 < 2.0$ is undefined. So, for that input, an input voltage change from 0.4V to 2.5V may be interpreted as a transition. An input voltage change from 2.8V to 1.8V and back to 2.4V may also be interpreted as a transition. But an input voltage change from 2.8V to 2.0V and back to 2.4V would not be interpreted as a transition for the example given.

A "scan chain" refers to a set of storage elements (e.g. flip-flops, latches, registers, memory cells, or the like) arranged into a shift register in addition to their normal operation in an integrated circuit. In some cases, the scan chain may be created using Level Sensitive Scan Design (LSSD) techniques using either single or dual latches. While many storage elements of a scan chain may have other functionality required for the operation of the IC, some storage elements may be included in the design of an IC only for the purposes of the scan chain or may be included to monitor a particular element of the design and have no purpose in the normal operation of the IC.

A "trace" refers to an electrical conductor inside an IC or on a printed circuit board.

A "value" may refer to the measurable electrical parameters (e.g. voltage or current) present on an electrical conductor or it may refer to the represented logical or numerical value represented by a particular measurement of those electrical parameters.

In the inventors' experiences, an IC often has inputs that may have special functionality used for control and test purposes. These special inputs (or I/O pins) may have to maintain a static value over a long time during normal chip operation. Examples for such inputs are Driver Inhibit, Receiver Inhibit, Leakage Test, Reference Enable, I/O Mode Control, Test Enable, and the like. Depending on the functionality of these static input pins, any logic change during normal chip operation on these pins may lead to unexpected or erroneous behavior of the chip. Reasons for such unintended logic changes at the inputs could be erroneous hardware driving these pins, or other error sources like noise and crosstalk. Such a failure may be very hard to detect in a system, since the error mechanisms triggered by those failures may be very complex.

In some cases, a group of inputs may be used to generate a signature that then can be monitored for value changes by the IC's core logic. This may allow the core logic to detect unexpected changes in the static inputs, but does not allow for detection of which input has the erroneous value since only the failure in a particular I/O group is reported. There is no indication which specific input in this group has unexpectedly changed its value.

The embodiments described herein are able to observe any chip input for changes in its logic value, while providing the ability to detect and isolate faults on static inputs to a single external input. Additional circuitry is integrated inside the I/O cell to detect and report transitions on an input and store that event for later analysis. There may be several different embodiments depending on the availability of a system clock and/or a scan path. The embodiments have minimal impact on existing design structures and/or methodologies. Minimal additional circuitry may be required and additional trace routing space may be minimized by daisy-chaining the error indications from the I/O cells and/or integrating the additional functionality into existing scan chains.

Reference now is made in detail to the examples illustrated in the accompanying drawings and discussed below.

FIG. 1 shows a block diagram of a general embodiment of an input cell 110 in an integrated circuit (IC) 100 with input error detection circuitry added. The IC 100 may have at least one I/O pad 111. The I/O pad 111 may itself be an external input of the IC 100 or it may be connected using wire bonds, flip-chip mounting, or other techniques, to an external input of some type of packaging of the IC 100. The I/O pad 111 may be connected to an input buffer 112 through an input of the input cell 110 although in some embodiments the I/O pad 111 may be a part of the input cell 110. In some cases, the I/O pad 111 may be connected to an I/O cell allowing both an input function and an output function. The input buffer 112 may be a simple electrical buffer providing regeneration of proper electrical parameters of an input value received at the I/O pad 111 to the Cell Output 113. In other embodiments, the input cell 110 may provide additional functionality between the value received at the I/O pad 111 and the Cell Output 113 such as electrical level translation, logical inversion, drive enable functions, I/O multiplexing, time delay, Boolean logic operations, and/or other functionality. Whatever intended functionality may be provided by the input cell 110 need not change with the addition of the input error detection circuitry. So for the embodiment shown in FIG. 1, input buffer 112 may not need to be changed from previous implementations that did not incorporate error detection of static inputs.

The input error detection and reporting circuitry which may be added for various embodiments includes a transition detection circuit 120. The transition detection circuit 120 monitors the input of the input cell 110 and may detect an unexpected transition on that input. It may monitor the output of the input buffer 112, it may be directly connected to the input of the input cell 110, or it could monitor the input from some other node in the input cell 110. The output of the transition detection circuit 120 may connected to a storage element 130 so that the unexpected transition of the input can be stored until any error detection or correction circuitry has had a chance to respond. The storage element 130 may be a sample and hold circuit, cross-coupled gates, a flip-flop, a latch, a capacitor, a memory cell or any other circuitry allowing a value to be stored for some period of time. An error input 141 may be daisy-chained with the output of the storage element 130 using the OR gate 140 driving the error output 142 so that an error detected in any input cell that is a part of the daisy-chained error indication may be detected using a single input of any error handling circuitry.

Figure 2:
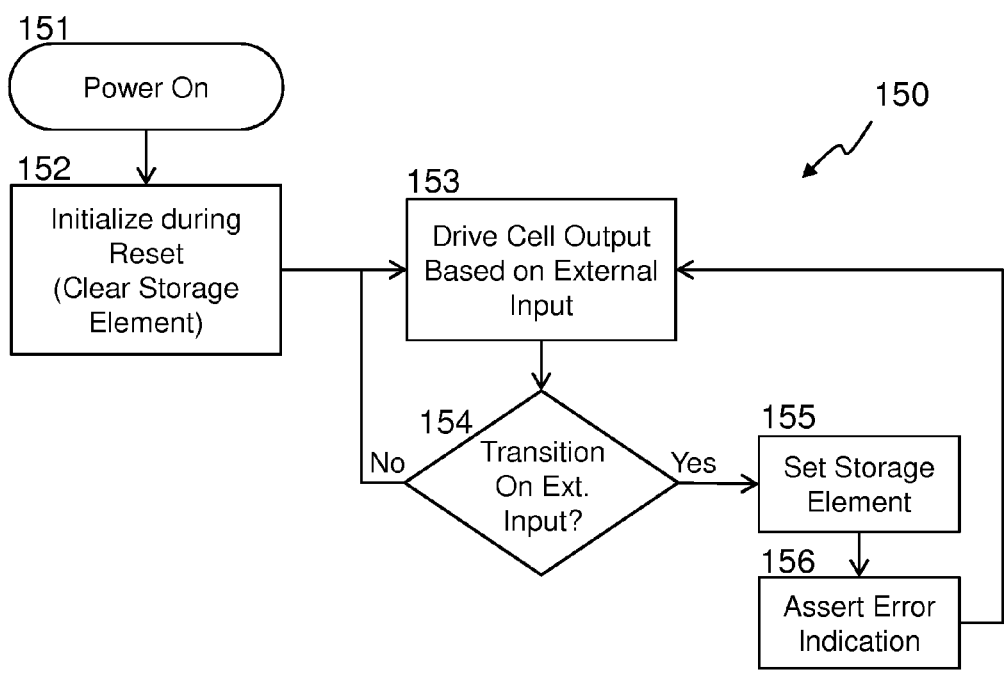
FIG. 2 shows a flow chart of an embodiment of a method for detecting an unstable input to an IC.

FIG. 2 shows a flow chart 150 of an embodiment of a method for detecting an unstable input to an IC 100. Once power is applied to the IC 100 at block 151, the IC 100 may be initialized at block 152. The initialization may take place during reset period of the IC 100 where a reset input is asserted to the IC 100. In other embodiments, the initialization may take place under the control of a processor setting particular values into registers of the IC 100. Other embodiments may self-initialize when power if first applied or by some other method. In most embodiments, a storage element 130 in an input cell 110 (or I/O cell) of the IC 100 may be cleared, or set to another predefined value, during initialization. At block 153, the input cell 110 may drive a Cell Output 113 based on the electrical parameters (which may represent a value) detected on an external input received through an I/O pad 111. The transition detection circuitry 120 may monitor the value received at the external input at block 154, looking for a transition on that external input at a time when it is not expected. Some embodiments may utilize an enable value to determine a time period when no transition is expected on the external input. If no unexpected transition is detected, the input 110 cell continues to drive the Cell Output 113 at block 153 and look for an unexpected transition at block 154. If an unexpected transition is detected at block 154, storage element 130 is set (or a different predefined value stored) at block 155. Once the storage element 130 is set, an error output 142 may be asserted at block 156 to alert any error handling circuitry that an error has been detected. Even after the error output 142 has been asserted, the input cell 110 continues to drive the Cell Output 113 at block 153 and may continue to look for unexpected transitions at block 154. Some embodiments of the method may drive the error output 142 if an error input 141 is asserted. Other embodiments of the method may include sending the output of the storage element 130 out of the input cell 110 through a shift output and shifting a shift input into the storage element 130 under control of a shift clock.

Figure 3:
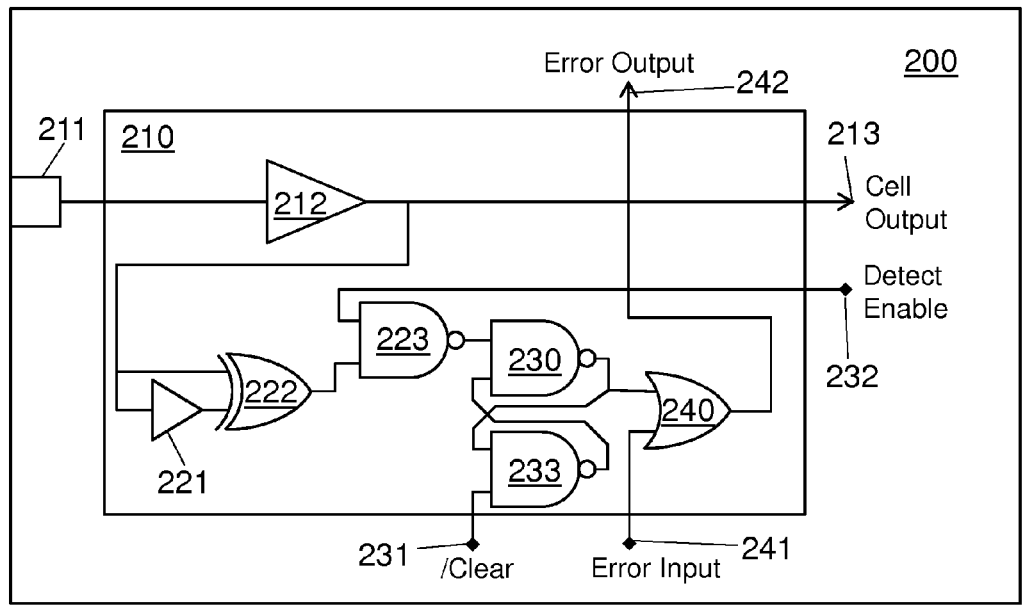
FIG. 3 shows a schematic of an embodiment of an input cell capable of detecting an unstable input to an IC.

FIG. 3 shows a schematic of an embodiment of an input cell 210 capable of detecting an unstable input to an IC 200. An external input is connected to an I/O pad 211 and the value received is sent through an input buffer 212 to a Cell Output 213. The output of the input buffer 212 may be sent through a delay buffer 221 to create a version of the input that is delayed by a predetermined length of time. The length of time may be highly dependent of the technology being used for the IC 200, but it should be long enough to allow the circuitry described hereafter to detect any transition on the external input. In one embodiment using current semiconductor processes, a delay of about 100 picoseconds may be sufficient but various embodiments may require widely varying predetermined delays ranging from the sub-picosecond range to several nanoseconds or more. The output of the input buffer 212 and the output of the delay buffer 221 are then sent to a Boolean exclusive OR gate (XOR) 222. The XOR gate 222 acts as the transition detection circuitry by comparing the external input value with a delayed version of itself and becoming a "1" only when the two values are different. The output of the XOR gate 222 is then fed into a NAND gate 223. The other input of the NAND gate 223 in the embodiment shown is a Detect Enable input 232 to the input cell 210 that may be received from the core logic or error handling blocks of the IC 200. Cross-coupled NAND gates 230, 233 create a /Set-/Reset flip-flop (SRFF) that may be used as the storage element for the transition detection. The SRFF may be cleared during initialization using the /Clear input 231. The output of the SRFF (output of NAND gate 230) is fed, along with error input 241, into OR gate 240 and the output of OR gate 240 may be sent out of the input cell 210 as error output 242.

Figure 4:
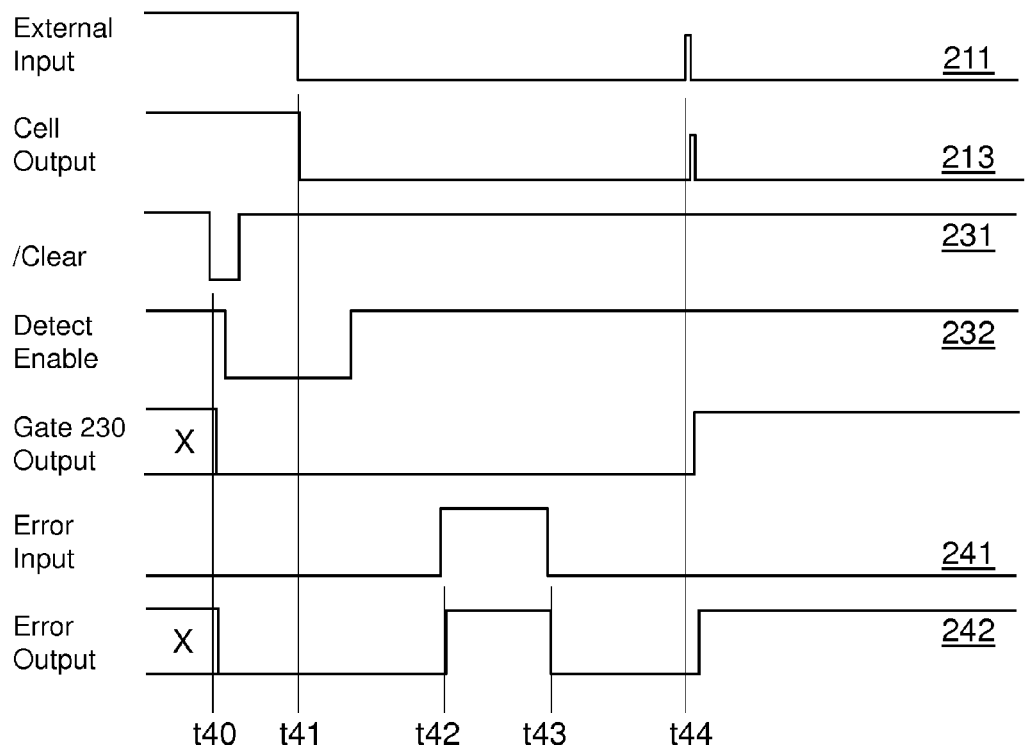
FIG. 4 shows a timing diagram of the operation of the embodiment of FIG. 3.

FIG. 4 shows a timing diagram of the operation of the embodiment of FIG. 3. The External Input corresponds to the voltage waveform received at the I/O pad 211 and the Cell Output 213 may simply be a buffered version of the external input. The /Clear input 231 is driven to a logic "0" at time t40. Since the External Input is stable at time t40, this causes the SRFF to be cleared so that the output of NAND gate 233 is a "1" and the output of NAND gate 230 is a "0". The External Input transitions from "1" to "0" at time t41, but because the Detect Enable 232 is "0" the SRFF is not set at this time. Error Input 241 is set to a "1" from time t42 to time t43 and Error Output is set to a "1" during this time as well (with a delay from OR gate 240). The External Input has a glitch at time t44 where it leaves the valid "0" state. This glitch is then delayed by delay buffer 221 and the two versions of the External Input are fed into the XOR gate 222 to generate a pulse at the output of the XOR gate 222 based on the input glitch. The design of the delay buffer 221 and XOR gate 222 may need to be done carefully so that the pulse created by an input glitch may create a valid pulse. The design of the delay buffer 221 and/or XOR gate 222 may need to incorporate different design parameters to allow electrical waveforms that might not be valid for the core logic of the IC 200 to still be properly detected by the transition detection circuitry. Unique features that might be required in the design of the input buffer 212, delay buffer 221 and/or XOR gate 222 may include changes to the electrical parameters defining a valid input, addition of high gain amplifiers, or other circuitry. At time t44, the Detect Enable input 232 is a "1", so NAND gate 223 passes through and inverts the output of the XOR gate 222 to the SRFF, setting the SRFF as shown by the waveform for the Gate 230 Output. The output of the SRFF is then sent through OR gate 240 to the Error Output 242, indicating that an error has been detected after time t44. The embodiment shown in FIG. 3 functions to detect an error on an input that was expected to be stable during the time that Detect Enable 232 is "1", but unless the Error Output 242 of each input cell 210 of the IC 200 is individually fed to error handling circuitry, which in the inventors' experiences is unwieldy, the error handing circuitry has no way to isolate the error to one particular input.

Figure 5:
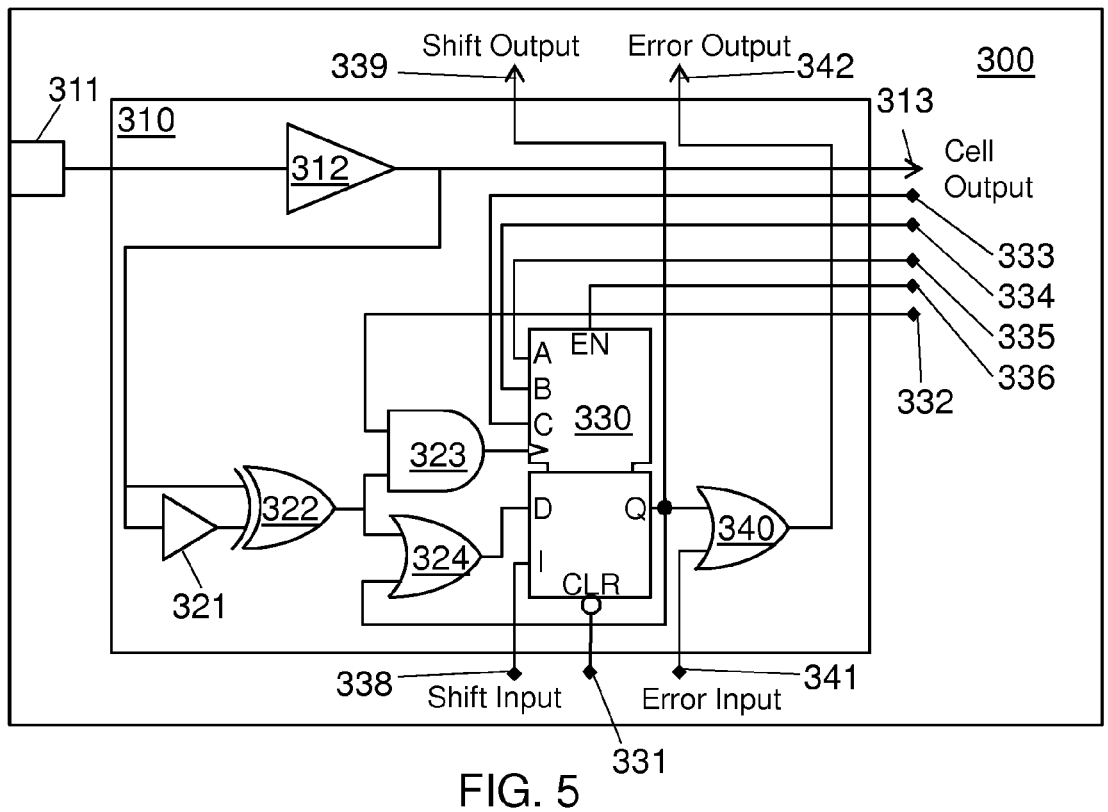
FIG. 5 shows a schematic of an embodiment of an input cell that may be included in a scan chain that is capable of detecting an unstable input to an IC.

FIG. 5 shows a schematic of an embodiment of an input cell 310 that may be included in a scan chain and may be capable of detecting an unstable input to an IC 300. The input cell 310 works in a very similar manner to the input cell 210 of FIG. 3 with the difference being that the SRFF of input cell 210 is replaced by a mixed-mode latch 330 in input cell 310 that can function either as an edge triggered "D" flip-flop or a level sensitive scan design (LSSD) master/slave latch to allow the value stored in the latch to be scanned out using a scan chain to allow error handling circuitry to isolate an error to a particular input.

An external input is connected to an I/O pad 311 and the value received is sent through an input buffer 312 to a Cell Output 313. The output of the input buffer 312 may be sent through a delay buffer 321. The output of the input buffer 312 and the output of the delay buffer 321 are then sent to a Boolean exclusive OR gate (XOR) 322. The output of the XOR gate 322 is then fed into a AND gate 323 with the other input being a Detect Enable input 332. In some embodiments, the Detect Enable function may be implemented as a register in the input cell 300 instead of a control input to the input cell 210. The register used for Detect Enable may or may not be a part of the scan chain. The output of the XOR gate 322 may also be sent to an OR gate 324 whose other input is the output of the mixed-mode latch 330 (which is used to maintain the value of the latch when synchronous sampling from the optional "C" clock 333 is used. The output of the AND gate 323 may be used as the edge trigger and the output of the OR gate 324 may be used as the "D" input for the "D" flip-flop functionality of the mixed mode latch 330. The EN input 336 may be used to enable the edge triggered clock of the mixed-mode latch 330. The mixed-mode latch 330 may be cleared during initialization using the /Clear input 331. The "Q" output of the mixed-mode latch 330 is fed, along with error input 341, into OR gate 340 and the output of OR gate 340 may be sent out of the input cell 310 as error output 342. Non-overlapping two phase clocks, "A" Clock 335 and "B" Clock 334 may be used to shift data in from the Shift Input 338, through the master/slave LSSD latches of the mixed-mode latch 330, and out the Shift Output 339.

Figure 6:
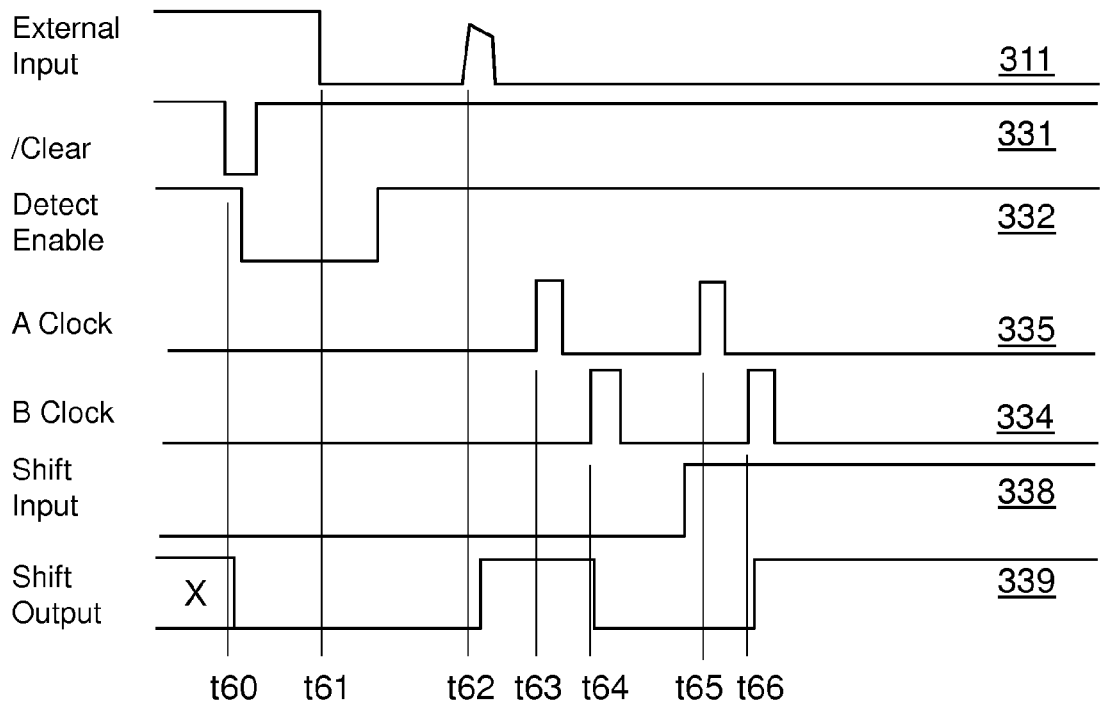
FIG. 6 shows a timing diagram of the operation of the embodiment of FIG. 5.

FIG. 6 shows a timing diagram of the operation of the embodiment of FIG. 5. The External Input corresponds to the voltage waveform received at the I/O pad 311. The /Clear input 331 is driven to a logic "0" at time t60 which clears the mixed-mode latch 330. The External Input transitions from "1" to "0" at time t61, but because the Detect Enable 332 is "0" mixed-mode latch 330 is not set at this time. The External Input has a glitch at time t62 where it leaves the valid "0" state. This glitch is then delayed by delay buffer 321 and the two versions of the External Input are fed into the XOR gate 322 to generate a pulse at the output of the XOR gate 322 based on the input glitch. At time t62, the Detect Enable input 332 is a "1", so AND gate 323 passes through the output of the XOR gate 322 to the edge trigger for the "D" flip-flop mode of the mixed-mode latch 330. The output of the XOR gate 322 is also fed through the OR gate 324 to the "D" input of the mixed-mode latch 330, so the mixed-mode latch 330 is set at this time causing the Shift Output 339 to be driven to a "1". At time t63 the "A" Clock 335 is active which latches the Shift Input 338, a "0" at time t63, into the master LSSD latch of the mixed mode latch 330. Then when the "B" Clock 334 goes active at time t64, the contents of the master LSSD latch are transferred into the slave LSSD latch of the mixed-mode latch 330 causing the Shift Output 339 to go to "0". The "A" Clock 335 is asserted again at time t65 causing the Shift Input, now a "1", to be latched into the master LSSD latch and then the "B" Clock 334 is asserted at time t66 moving the contents of the master LSSD latch into the slave LSSD latch of the mixed-latch 330, causing the Shift Output 339 to go to "1".

By chaining together all I/O cells embodied as shown in FIG. 5, error data may be shifted out at any time for detailed fault analysis. Therefore, the error outputs of all I/O cells may be combined to one or more error indications without losing the ability to isolate the location of the fault. This combination into one error signal may be done by an OR tree that is either part of the I/O cells as sown in FIGS. 1, 3, 5 & 7, or implemented in the core logic of the IC.

Figure 7:
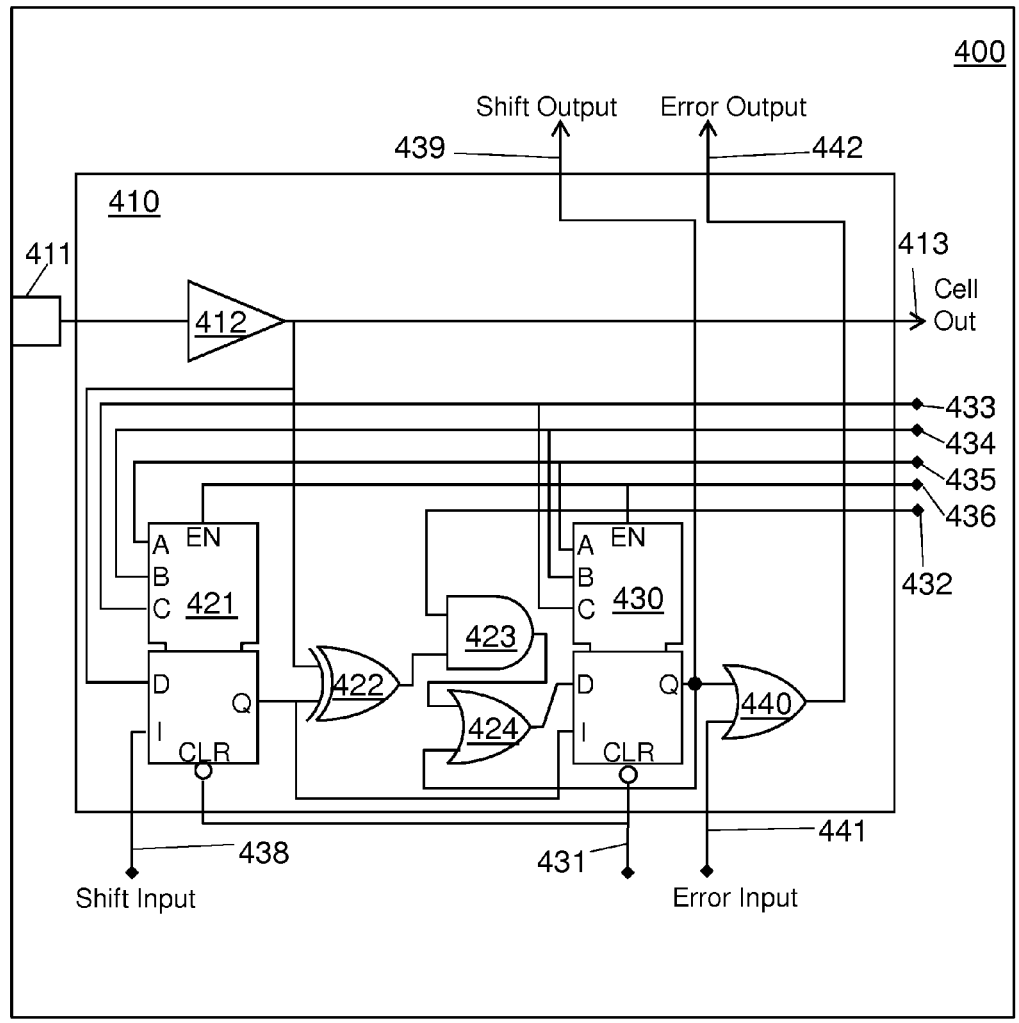
FIG. 7 shows a schematic of an embodiment of a fully synchronous input cell that may be included in a scan chain that is capable of detecting an unstable input to an IC.

FIG. 7 shows a schematic of an embodiment of a fully synchronous input cell 410 that may be included in a scan chain and is capable of detecting an unstable input to an IC 400. The input cell 410 works in a very similar manner to the input cell 310 of FIG. 5 with the difference being two LSSD latches 430, 421 are used in place of the single mixed-mode latch 330 to provide for full synchronous operation of the input cell 410.

An external input is connected to an I/O pad 411 and the value received is sent through an input buffer 412 to a Cell Output 413. The output of the input buffer 412 may be sent to the "D" input of the mixed mode latch 421 which may capture the input using the "C" Clock 433 to synchronously clock in the value. The "Q" output of the mixed-mode latch 421 creates delayed version of output of the input buffer 412, which may be sent to a to a Boolean exclusive OR gate (XOR) 422, with the output of the input buffer 412 as the other input, to detect a transition on the external input. In this embodiment, only those transitions that are detectable when the input is synchronously sampled may be detected. The output of the XOR gate 422 is then fed into a AND gate 423 with the other input being a Detect Enable input 432, and to the output of the AND gate 423 may then be sent to an OR gate 424 whose other input is the output of the mixed-mode latch 430 to hold the value once it has been set. The output of the OR gate 424 may be then used as the "D" input for the "D" flip-flop functionality of the mixed mode latch 430 which is clocked into the latch using the "C" Clock 433. The mixed-mode latches 421, 430 may be cleared during initialization using the /Clear input 431. The "Q" output of the mixed-mode latch 430 is fed, along with error input 441, into OR gate 440 and the output of OR gate 440 may be sent out of the input cell 410 as error output 442. Non-overlapping two phase clocks, "A" Clock 435 and "B" Clock 434 may be used to shift data through the master/slave LSSD latches of the mixed mode latches 421, 430, shifting in data from the Shift Input 438 and out of the Shift Output 439. The master "C" clock 433 may be enabled using the EN input 436.

Figure 8:
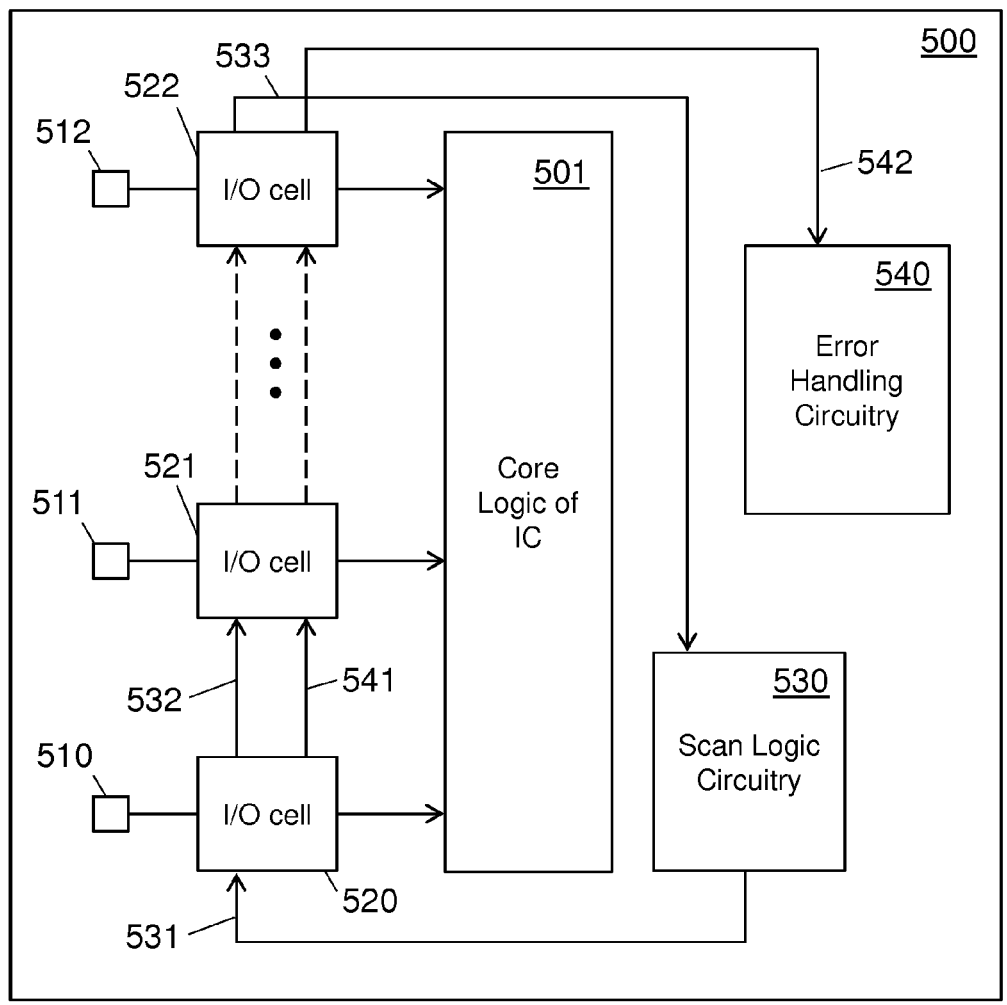
FIG. 8 shows a block diagram of an IC utilizing input cells capable of detecting an unstable input and utilizing a scan chain to isolate the error.

FIG. 8 shows a block diagram of an IC 500 utilizing input cells 510, 511, 512 capable of detecting unstable inputs and utilizing a scan chain to isolate the error. The IC 500 may have core logic 501 that implements functionality of the IC 500. The core logic 501 may have connections to external inputs through I/O cells such as the input cells 520, 521, 522 which may receive the external inputs from I/O pads 510, 511 512. The input cells 520, 521, 522 may utilize embodiments such as those shown in FIGS. 1, 3, 5, & 7 or may utilize different embodiments. Various clocks, clear, enable, and other control inputs that may be required by embodiments of input cells are not shown in FIG. 8 for clarity. In the embodiment shown, input cell 520 may generate an error output 541 if an unexpected transition is detected on the external input connected to I/O pad 510. The error output 541 may be sent to the error input of input cell 521 which continues the daisy-chain of the error indication through to other input cells. A final input cell 522 of the daisy-chain may then send its error output 542, which may effectively be the Boolean OR of all error indications of all the daisy-chained input cells, to error handing circuitry 540. The error handing circuitry 540 may be configured to respond to the error indication in many different ways, depending on the specific embodiment and the current operating mode of the IC 500. In one embodiment, the error handing circuitry 540 may cause the IC 500 to halt operation in response to the error while another embodiment may simply ignore the error unless the IC 500 is in a specific test mode. In another embodiment, the error handing circuitry 540 may raise an interrupt to a processor which may then execute an error handling routine in software that may inform a user or other connected electronic systems of the error, may more fully diagnose the fault, may attempt to recover from the error, may reset the IC 500 or other parts of the electronic system containing the IC 500, may execute a more complete system diagnostic, or may take any number of other actions.

In at least one embodiment, the error handing circuitry 540 may communicate with scan logic circuitry 530, which may then shift data out of a shift output 531 to the shift input of input cell 520. Input cell 520 may shift its latched error indication 532 out to the shift input of input cell 521 which may continue to shift data through the scan chain to the final input cell 522. The shift output 533 of the final input cell 522 may then be sent back to the scan logic 530. The scan chain may be set up so that only those input cells with external inputs that are expected to be stable are in the scan chain, all input cells are included in the scan chain, all I/O cells are included in a standard boundary scan configuration for the scan chain, some other LSSD latches from other portions of the circuitry within the IC 500 are included in the scan chain, all LSSD latches in the IC 500 are included in a single scan chain, or any subset of the latches in the input cells and the rest of the IC 500 are included the scan chain. Some embodiments may have multiple scan chains, each with a different subset of latches within the IC 500. The scan logic circuitry 530 may communicate back to the error handling circuitry 540 to allow for specific identification of which external input had the unexpected transition.

Figure 9:
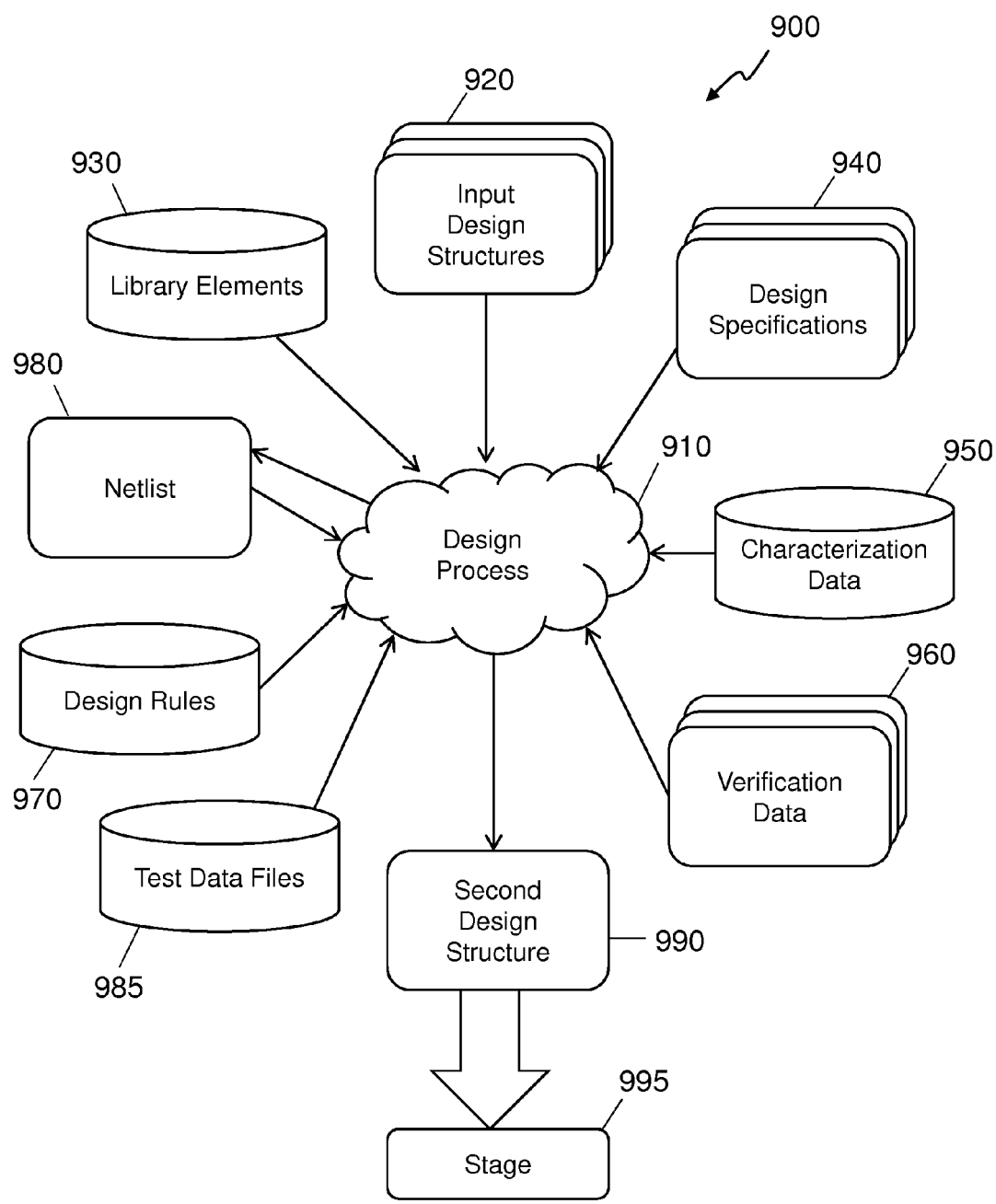
FIG. 9 is a flow diagram of a design process used in semiconductor design, manufacture, and/or test.

FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 3, 5, 7 & 8. The design structures processed and/or generated by design flow 900 may be encoded on machine-readable transmission or non-transitory storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that may be processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 3, 5, 7 & 8. As such, design structure 920 may include files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 may employ and incorporate hardware and/or software modules for synthesizing, translating, or otherwise processing a design/simulation functional equivalent of the components, circuits, devices, or logic structures shown in FIGS. 1, 3, 5, 7 & 8 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a non-transitory machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 may include one or more files, data structures, or other computer-encoded data or instructions that reside on transmission or data storage media and that when processed by an ECAD system generate a logically or otherwise functionally equivalent form of one or more of the embodiments shown in FIGS. 1, 3, 5, 7 & 8. In one embodiment, design structure 990 may comprise a compiled, executable HDL simulation model that functionally simulates the devices shown in FIGS. 1, 3, 5, 7 & 8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/ developer to produce a device or structure as described above and shown in FIGS. 1, 3, 5, 7 & 8. Design structure 990 may then proceed to a stage 995 where, for example, design structure 990: proceeds to tape-out, is released to manufacturing, is released to a mask house, is sent to another design house, is sent back to the customer, and/or other actions are taken.

Figure 10:
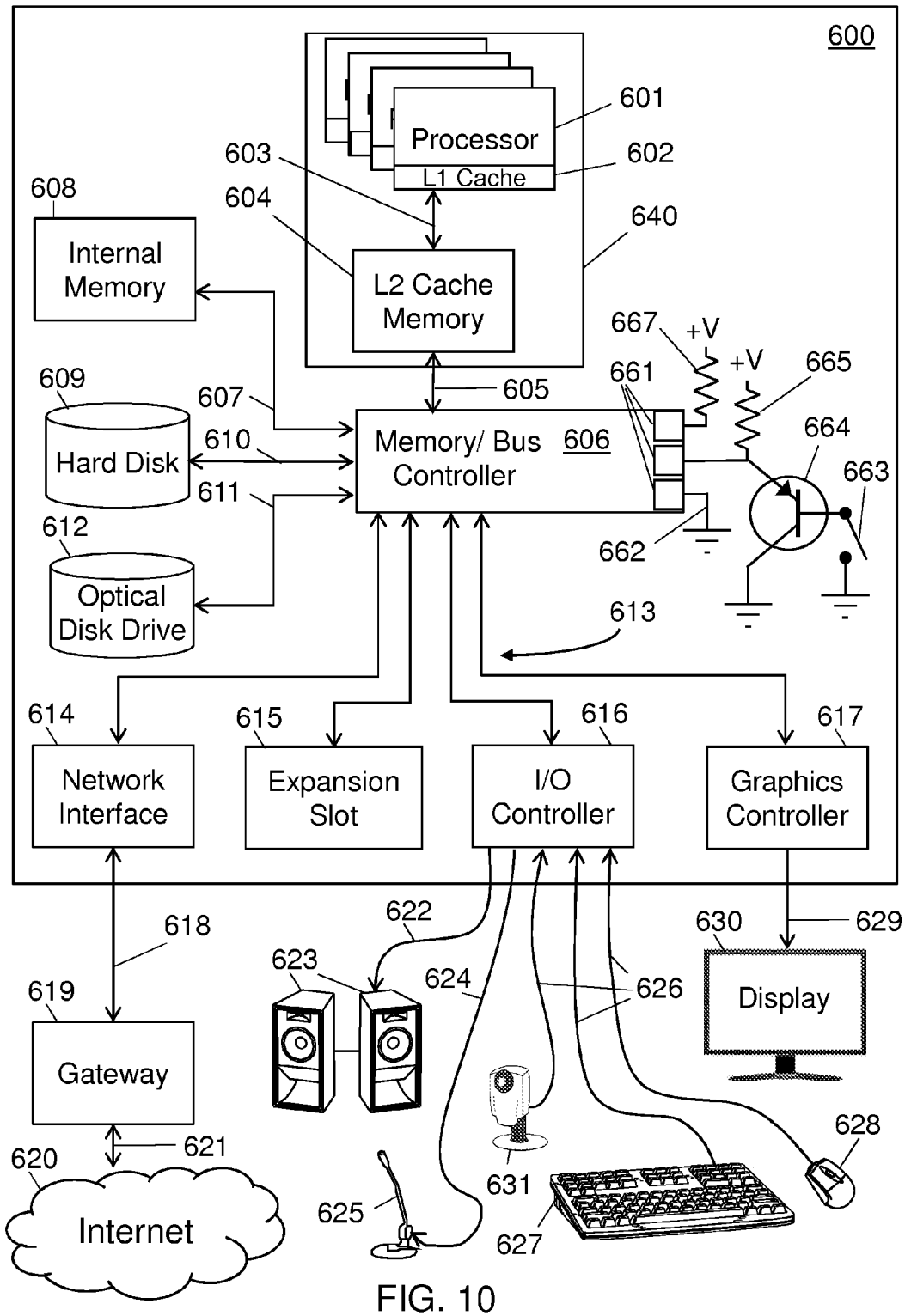
FIG. 10 is a block diagram of an electronic system that utilizes an IC with input cells capable of detecting an unstable input and that may be utilized to implement one or more of the design processes of FIG. 9.

FIG. 10 is a block diagram of an electronic system, in this embodiment, a computer system 600, that utilizes an IC 606 with input cells 661 capable of detecting an unstable input. In other embodiments, the electronic system may be a network router, a television, an industrial robot, a satellite, an engine controller, an electronic theodolite, or any other electronic system using an integrated circuit. The computer system 600 may also be utilized to implement one or more of the design processes of FIG. 9. The input cells 661 may be utilized for inputs that may be used to configure the IC 606 during a reset or other initialization period, and as such, those inputs are not expected to transition during other times in the operation of the IC 606 or the inputs could be expected to be stable for of other reasons. The input cells 661 may be connected to a variety of different circuits of the electronic system 600 to maintain the stability of those inputs such as a ground connection 662, a pull-up resistor 667, or an active circuit such as switch 663, transistor 664 and resistor 665. Any type of circuit may be used for the purposes of attempting to maintain a stable input value for an external input to the IC 606 for at least certain periods of time.

The computer system 600 may be configured in the form of a desktop computer, a laptop computer, a mainframe computer, or any other hardware or logic arrangement capable of being programmed or configured to carry out instructions. In some embodiments the computer system 600 may act as a server, accepting inputs from a remote user over a local area network (LAN) 618 or the internet 620. In other embodiments, the computer system 600 may function as a smart user interface device for a server on a LAN 618 or over the internet 620. The computer system 600 may be located and interconnected in one location, or may be distributed in various locations and interconnected via communication links such as a LAN 618 or a wide area network (WAN), via the Internet 620, via the public switched telephone network (PSTN), a switching network, a cellular telephone network, a wireless link, or other such communication links. Other devices may also be suitable for implementing or practicing the embodiments, or a portion of the embodiments. Such devices include personal digital assistants (PDA), wireless handsets (e.g., a cellular telephone or pager), and other such electronic devices preferably capable of being programmed to carry out instructions or routines. One skilled in the art may recognize that many different architectures may be suitable for the computer system 600, but only one typical architecture is depicted in FIG. 10.

Computer system 600 may include a processor 601 which may be embodied as a microprocessor, two or more parallel processors as shown in FIG. 10, a central processing unit (CPU) or other such control logic or circuitry. The processor 601 may be configured to access a local cache memory 602, and send requests for data that are not found in the local cache memory 602 across a cache bus 604 to a second level cache memory 604. Some embodiments may integrate the processor 601, and the local cache 602 onto a single integrated circuit and other embodiments may utilize a single level cache memory or no cache memory at all. Other embodiments may integrate multiple processors 601 onto a single die and/or into a single package. Yet other embodiments may integrate multiple processors 601 with multiple local cache memories 602 with a second level cache memory 604 into a single package 640 with a front side bus 605 to communicate to a memory/bus controller 606. The memory/bus controller 606 may accept accesses from the processor(s) 601 and direct them to either the internal memory 608 or to the various input/output (I/O) busses 610, 611, 613. Some embodiments of the computer system 600 may include multiple processor packages 640 sharing the front-side bus 605 to the memory/bus controller. Other embodiments may have multiple processor packages 640 with independent front-side bus connections to the memory/bus controller. The memory bus controller may communicate with the internal memory 608 using a memory bus 607. The internal memory 608 may include one or more of random access memory (RAM) devices such as synchronous dynamic random access memories (SDRAM), double data rate (DDR) memories, or other volatile random access memories. The internal memory 608 may also include non-volatile memories such as electrically erasable/programmable read-only memory (EEPROM), NAND flash memory, NOR flash memory, programmable read-only memory (PROM), read-only memory (ROM), battery backed-up RAM, or other non-volatile memories. In some embodiments, the computer system 600 may also include $3^{rd}$ level cache memory or a combination of these or other like types of circuitry configured to store information in a retrievable format. In some implementations the internal memory 608 may be configured as part of the processor 601, or alternatively, may be configured separate from it but within the same package 640. The processor 601 may be able to access internal memory 608 via a different bus or control lines than is used to access the other components of computer system 600.

The computer system 600 may also include, or have access to, one or more hard drives 609 (or other types of storage memory) and optical disk drives 612. Hard drives 609 and the optical disks for optical disk drives 612 are examples of machine readable (also called computer readable) mediums suitable for storing the final or interim results of the various embodiments. The optical disk drives 612 may include a combination of several disc drives of various formats that can read and/or write to removable storage media (e.g., CD-R, CD-RW, DVD, DVD-R, DVD-W, DVD-RW, HD-DVD, Blu-Ray, and the like). Other forms or computer readable media that may be included in some embodiments of computer system 600 include, but are not limited to, floppy disk drives, 9-track tape drives, tape cartridge drives, solid-state drives, cassette tape recorders, paper tape readers, bubble memory devices, magnetic strip readers, punch card readers or any other type or computer useable storage medium. The computer system 600 may either include the hard drives 609 and optical disk drives 612 as an integral part of the computer system 600 (e.g., within the same cabinet or enclosure and/or using the same power supply), as connected peripherals, or may access the hard drives 609 and optical disk drives 609 over a network, or a combination of these. The hard drive 609 often includes a rotating magnetic medium configured for the storage and retrieval of data, computer programs or other information. In some embodiments, the hard drive 609 may be a solid state drive using semiconductor memories. In other embodiments, some other type of computer useable medium may be used. The hard drive 609 need not necessarily be contained within the computer system 600. For example, in some embodiments the hard drive 609 may be server storage space within a network that is accessible to the computer system 600 for the storage and retrieval of data, computer programs or other information. In some instances the computer system 600 may use storage space at a server storage farm, or like type of storage facility, that is accessible by the Internet 620 or other communications lines. The hard drive 609 is often used to store the software, instructions and programs executed by the computer system 600, including for example, all or parts of the computer application program for carrying out activities of the various embodiments.

Communication links 610, 611 may be used to access the contents of the hard drives 609 and optical disk drives 612. The communication links 610, 611 may be point-to-point links such as Serial Advanced Technology Attachment (SATA) or a bus type connection such as Parallel Advanced Technology Attachment (PATA) or Small Computer System Interface (SCSI), a daisy chained topology such as IEEE-1394, a link supporting various topologies such as Fibre Channel, or any other computer communication protocol, standard or proprietary, that may be used for communication to computer readable medium. The memory/bus controller may also provide other I/O communication links 613. In some embodiments, the links 613 may be a shared bus architecture such as peripheral component interface (PCI), microchannel, industry standard architecture (ISA) bus, extended industry standard architecture (EISA) bus, VERSAmodule Eurocard (VME) bus, or any other shared computer bus. In other embodiments, the links 613 may be a point-to-point link such as PCI-Express, HyperTransport, or any other point-to-point I/O link. Various I/O devices may be configured as a part of the computer system 600. In many embodiments, a network interface 614 may be included to allow the computer system 600 to connect to a network 618. The network 618 may be an IEEE 802.3 ethernet network, an IEEE 802.11 Wi-Fi wireless network, or any other type of computer network including, but not limited to, LANs, WAN, personal area networks (PAN), wired networks, radio frequency networks, powerline networks, and optical networks. A network gateway 619 or router, which may be a separate component from the computer system 600 or may be included as an integral part of the computer system 600, may be connected to the network 618 to allow the computer system 600 to communicate with the internet 620 over an internet connection 621 such as an asymmetric digital subscriber line (ADSL), data over cable service interface specification (DOCSIS) link, T1 or other internet connection mechanism. In other embodiments, the computer system 600 may have a direct connection to the internet 620. In some embodiments, an expansion slot 615 may be included to allow a user to add additional functionality to the computer system 600.

The computer system 600 may include an I/O controller 616 providing access to external communication interfaces such as universal serial bus (USB) connections 626, serial ports such as RS-232, parallel ports, audio in 625 and audio out 622 connections, the high performance serial bus IEEE-1394 and/or other communication links. These connections may also have separate circuitry in some embodiments, or may be connected through a bridge to another computer communication link provided by the I/O controller 616. A graphics controller 617 may also be provided to allow applications running on the processor 601 to display information to a user. The graphics controller 617 may output video through a video port 629 that may utilize a standard or proprietary format such as an analog video graphic array (VGA) connection, a digital video interface (DVI), a digital high definition multimedia interface (HDMI) connection, or any other video connection. The video connection 629 may connect to display 630 to present the video information to the user. The display 630 may be any of several types of displays, including a liquid crystal display (LCD), a cathode ray tube (CRT) monitor, on organic light emitting diode (OLED) array, or other type of display suitable for displaying information for the user. The display 630 may include one or more light emitting diode (LED) indicator lights, or other such display devices. Typically, the computer system 600 includes one or more user input/output (I/O) devices such as a keyboard 627, mouse 628, and/or other means of controlling the cursor represented including but not limited to a touchscreen, touchpad, joystick, trackball, tablet, or other device. The user I/O devices may connect to the computer system 600 using USB 626 interfaces or other connections such as RS-232, PS/2 connector or other interfaces. Some embodiments may include webcam 630 which may connect using USB 626, a microphone 625 connected to an audio input connection 624 and/or speakers 623 connected to an audio output connection 622. The keyboard 627 and mouse 628, speakers 623, microphone 625, webcam 631, and monitor 630 may be used in various combinations, or separately, as means for presenting information to the user and/or receiving information and other inputs from a user to be used in carrying out various programs and calculations. Speech recognition software may be used in conjunction with the microphone 625 to receive and interpret user speech commands.

The computer system 600 may be suitable for use in the design flow 900. For example, the processor 601 may be embodied as a microprocessor, microcontroller, DSP, RISC processor, two or more parallel processors, or any other type of processing unit that one of ordinary skill would recognize as being capable of performing or controlling some of the functions, activities and methods indicated in FIG. 9. May be able to operate computer software programs used in the design flow 900 that may be stored (embodied) on computer-readable medium such those compatible with the disk drives 609, the optical disk drive 612 or any other type of hard disk drive, floppy disk, flash memory, ram, or other computer readable medium. Various design structures may also be stored (embodied) on computer-readable medium such those compatible with the disk drives 609, the optical disk drive 612 or any other type of hard disk drive, floppy disk, flash memory, ram, or other computer readable medium as recognized by those of ordinary skill in the art.

Referring again to FIG. 1, the input cell 110 may be represented by various design structures. In one potential design flow a design specification 940 for the input cell 110 may be used to develop a hardware description language (HDL) design structure of the input cell 110 on computer system 600. The HDL design structure may allow for simulation of the functionality of the input cell 100 on the computer system 600 or other computer system. Other software programs running on the computer system 600, or other computer system, may utilize the HDL design structure of the input cell 110, along with a cell library, design rules and other files, to create a netlist design structure of the input cell 110. Yet other programs running on computer system 600 (or other computer system) may take the netlist design structure and other files as inputs to generate layout data design structures for the input cell 110. The design structures listed above may be stored on computer readable medium, incorporated into a mask set for an integrated circuit, embedded in a programmable gate array, or embodied in some other physical medium.

Aspects of various embodiments are described with reference to flowchart illustrations and/or block diagrams of methods, apparatus, systems, and computer program products according to various embodiments disclosed herein. It will be understood that various blocks of the flowchart illustrations and/or block diagrams, and combinations of blocks in the flowchart illustrations and/or block diagrams, may, in some cases, be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and/or block diagrams in the figures help to illustrate the architecture, functionality, and operation of possible implementations of apparatus, design structures, systems, methods and computer program products of various embodiments. In this regard, each block in the flowchart or block diagrams may represent the function of a module, segment, or portion of circuitry. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes," and/or "including" used in this specification specify the presence of stated features, integers, steps, operations, elements, and/or components, but do not preclude the presence or addition of one or more other features, integers, steps, operations, elements, components, and/or groups thereof. The term "obtaining", as used herein and in the claims, may mean either retrieving from a computer readable storage medium, receiving from another computer program, receiving from a user, calculating based on other input, or any other means of obtaining a datum or set of data.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or to limit the invention to the forms disclosed. Many modifications and variations will be apparent to those of ordinary skill in the art without departing from the scope and gist of the invention. The various embodiments included herein were chosen and described in order to best explain the principles of the invention and the practical application, and to enable others of ordinary skill in the art to understand the invention for various embodiments with various modifications as are suited to the particular use contemplated.

What is claimed is:

1. A method for detecting unstable inputs to an integrated circuit, the method comprising:

receiving an input value on an external input of the integrated circuit, wherein said external input is communicatively coupled to an input cell of the integrated circuit;

driving a first output trace from the input cell based on said input value;

detecting a transition on said external input during a time period that said external input is expected to be stable;

storing a value representing said transition into a storage element; and asserting an error output on a second output trace in response to said transition.

2. The method of claim 1, further comprising:

receiving an error indication at an error input of the input cell; and asserting the error output in response to said error indication.

3. The method of claim 1, further comprising:

sending the value stored in the storage element out of the input cell through a shift output of the input cell;

receiving a new value from a shift input of the input cell; and storing said new value into the storage element.

4. The method of claim 3, wherein the storage element utilizes level sensitive scan design (LSSD) techniques.

5. The method of claim 1, further comprising:

receiving an enabling value at the input cell during the time period that said external input is expected to be stable.

6. An integrated circuit comprising:

a first external input;

a trace in the integrated circuit configured to be driven based on an electrical level received at the first external input;

a storage element capable of being set to a value selected from the group consisting of a first value and a second value;

initialization circuitry configured to set the storage element to the first value before a time period that the external input is expected to be stable;

transition detection circuitry configured to detect a transition on the first external input during said time period and set the storage element to the second value in response to said transition; and an error output trace configured to be driven based on the value set in the storage element.

7. The integrated circuit of claim 6, further comprising:

error handling circuitry, wherein the error handling circuitry is operably coupled to the error output trace.

8. The integrated circuit of claim 6, further comprising:

an enable trace, wherein the enable trace is configured to be driven with an enabling value during said time period.

9. The integrated circuit of claim 6, further comprising:

an error input trace configured to be driven based on whether an unexpected transition was detected on a second external input, wherein the error output trace is configured to be driven based a value received from the error input trace.

10. The integrated circuit of claim 6, further comprising:

a shift input trace configured to provide a shift input value;

a shift output trace configured to be driven based on the value set in the storage element; and a shift clock trace configured to be allow the shift input value to be stored in the storage element.

11. The integrated circuit of claim 10, further comprising:

a boundary scan chain comprising the storage element.

12. The integrated circuit of claim 6, wherein said integrated circuit is part of an electronic system comprising:

circuitry configured to drive said first external input to a stable value during said time period; and error handling circuitry, wherein the error handling circuitry is operably coupled to the error output trace.

13. The integrated circuit of claim 12, further comprising:
an enable trace, wherein the enable trace is driven with an enabling value during said time period.

14. The integrated circuit of claim 12, wherein the electronic system further comprises:
circuitry configured to drive a second external input of the integrated circuit;
wherein the integrated circuit further comprises an error input trace configured to be driven based on whether an erroneous transition was detected on the second external input; and
wherein the error output trace is configured to be driven based a value received from the error input trace.

15. The integrated circuit of claim 12, further comprising:
a shift input trace configured to provide a shift input value;
a shift output trace configured to be driven based on the value set in the storage element; and
a shift clock trace configured to be allow the shift input value to be stored in the storage element.

16. The integrated circuit of claim 12, further comprising:
a boundary scan chain comprising the storage element.

17. A design structure tangibly embodied in a non-transitory machine readable medium for designing, simulating, manufacturing, or testing an integrated circuit, the design structure comprising:

a trace configured to be driven based on an electrical level received at a first input;

a storage element capable of being set to a value selected from the group consisting of a first value and a second value;

initialization circuitry configured to set the storage element to the first value before a time period that the external input is expected to be stable;

transition detection circuitry configured to detect a transition on the first input during said time period and set the storage element to the second value in response to said transition; and an error output trace configured to be driven based on the value set in the storage element.

18. The design structure of claim 17, wherein the design structure comprises a netlist.

19. The design structure of claim 17, wherein the design structure comprises a representation based on a hardware description language.

20. The design structure of claim 17, wherein the design structure resides on the non-transitory machine readable medium as a data format used for the exchange of layout data of integrated circuits.

21. The design structure of claim 17, wherein the design structure resides in a programmable gate array.

* * * * *